United States Patent [19]

Zachry et al.

[11] 3,953,924

[45] May 4, 1976

[54] PROCESS FOR MAKING A MULTILAYER INTERCONNECT SYSTEM

[75] Inventors: Clyde L. Zachry, La Habra; Andrew J. Niedzwiecke, Perris, both of Calif.

[73] Assignee: Rockwell International Corporation, El Segundo, Calif.

[22] Filed: June 30, 1975

[21] Appl. No.: 591,591

[52] U.S. Cl. ................................ 29/625; 29/628; 174/68.5; 204/15; 228/188
[51] Int. Cl.² ........................................ B41M 3/08
[58] Field of Search .................... 29/625, 626, 628; 174/68.5; 317/101 B, 101 F; 427/96, 97, 98, 99, 123–125, 156, 328, 402, 403, 405, 409, 410, 419; 228/188, 208, 209; 204/15, 35 N, 23, 38 AL

[56] References Cited

UNITED STATES PATENTS

| | | | |
|---|---|---|---|
| 3,098,951 | 7/1963 | Amer et al. | 174/68.5 X |
| 3,152,938 | 10/1964 | Osifchin et al. | 204/15 X |
| 3,324,014 | 6/1967 | Modjeska | 204/15 |
| 3,835,531 | 9/1974 | Luttmer | 228/188 X |

*Primary Examiner*—C. W. Lanham
*Assistant Examiner*—James R. Duzan
*Attorney, Agent, or Firm*—H. Frederick Hamann; G. Donald Weber, Jr.; Morland Charles Fischer

[57] ABSTRACT

A process for making an interconnect system for a multilayer circuit pattern. The interconnect system is formed having minimized through-hole space consumption so as to be suitable for high density, closely meshed circuit patterns.

7 Claims, 6 Drawing Figures

PROCESS FOR MAKING A MULTILAYER INTERCONNECT SYSTEM

The invention described herein was made in the performance of work under NASA Contract No. NASA 1-12435 and is subject to the provision of Section 305 of the National Aeronautics and Space Act of 1958 (72 STA. 435;42 U.S.C. 2457).

BACKGROUND OF THE INVENTION

1. Field of the Invention

This invention relates to a process for making a compact multilayer circuit interconnect system.

2. Prior Art

One example of a conventional process for making a multilayer circuit interconnect system includes forming holes in a nonconductive substrate and then building up the holes by an electroless plating technique. An alternative process includes filling the holes formed in the substrate with a swage tube. Electrical components received by the holes are electrically interconnected with conductive layers on opposite sides of the substrate through a plated hole or a swage tube. Another conventional process includes filling the holes formed in the nonconductive substrate with "balls" of conductive material (e.g. solder) and heating or pressing the balls to interconnect conductive layers of the circuit pattern. Yet another conventional multilayer circuit interconnect process includes physically jumping together conductive layers on opposite sides of the nonconductive substrate.

However, these conventional processes for forming a multilayer interconnect system consume relatively large amounts of areas on a nonconductive substrae, such as a printed circuit board, a flexible film and the like. As a consequence of the relatively large areas consumed, an interconnect system formed in accordance with any of the conventional processes is unsuitable when employed with circuit patterns having closely meshed, high density conductor lines.

SUMMARY OF THE INVENTION

Briefly, and in general terms, the process for making the multilayer circuit interconnect system of the instant invention includes the steps of forming a first layer of the interconnect system by applying a masking material in a predetermined pattern to a continuous sheet of electrically conductive material. The masking material pattern includes predetermined unmasked areas, determined by the desired locations of the feed-throughs or vias of the circuit pattern. The unmasked areas formed in the masking material are filled with an electrically conductive material. The layer of masking material is removed from the conductive sheet, leaving only a pattern of raised conductors on the conductive sheet. An electrically insulating base member is selectively cut or punched to include voids which generally correspond in configuration to that of the raised conductors. The conductive sheet and the base member are aligned with one another so that the raised conductors on the conductive layer extend into the voids which have been selectively punched into the base member. The conductive sheet is then affixed to the base member.

A second layer of the instant interconnect system is formed by repeating the steps herein described. The first and second layers are aligned relative to one another so that the respective raised conductors on each conductive sheet extend through the selectively punched voids in the base member. The second conductive sheet is then affixed to the base member. The raised conductor portions of each layer are secured to one another by suitable metallurgical joining process thereby forming the vias or feed-throughs which interconnect conductive layers on opposite sides of the base member. The desired circuit pattern to be formed on both sides of the insulating base member is defined by removing the excess of the continuous conductive sheets and the laminating material from the composite laminate formed by the first and second layers. Thus, a multilayer circuit interconnect system which consumes minimal area is formed having a continuous electrically conductive path on both sides of the insulating base member.

DESCRIPTION OF THE PREFERRED EMBODIMENT

Figure 1:
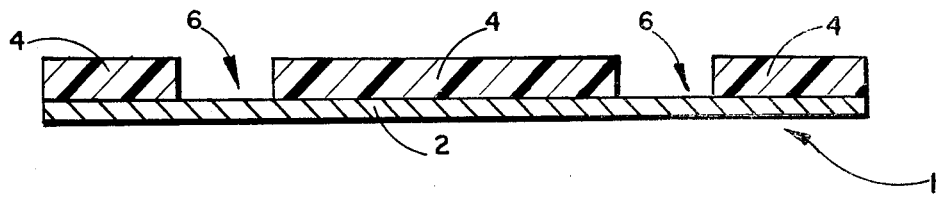
FIGS. 1–6 illustrate the steps of the instant process for making a multilayer circuit interconnect system.

FIG. 1 shows the initial step of the process for making the multilayer circuit interconnect system of the instant invention. A first layer 1 of the interconnect system is formed by applying a masking material 4 in a predetermined pattern to a continuous sheet 2 of electrically conductive material. In a preferred embodiment, one example of a typical masking material 4 is that known in the art as RISTON. An example of a suitable conductive material comprising continuous sheet 2 is copper. However, it is to be understood, that other suitable electricaly conductive materials (e.g. such as aluminum) and masking materials may also be employed. The prescribed pattern of the masking material 4 applied to conductor sheet 2 is determined by the desired locations of the feedthroughs or vias which interconnect conductive layers of the circuit. The masking material pattern 4 selectively includes predetermined unmasked areas 6 which will subsequently contain the feedthroughs, as will be explained in greater detail hereinafter.

Figure 2:
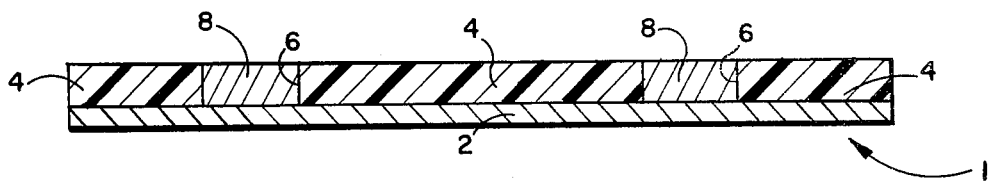

Referring now to FIG. 2, the unmasked areas 6, selectively included in the masking material pattern 4, are filled with an electrically conductive material 8 in a suitable manner. For example, electroforming, amalgam filling or other techniques may be used. In a preferred embodiment of the invention, but not regarded as a limitation thereof, the unmasked areas 6 are filled with gold. This or any other suitable electrically conductive material (e.g. copper or solder) may be employed. However, the material 8 is required to be easily joinable to itself or to another conductive material, the purpose of which will soon become apparent.

Figure 3:
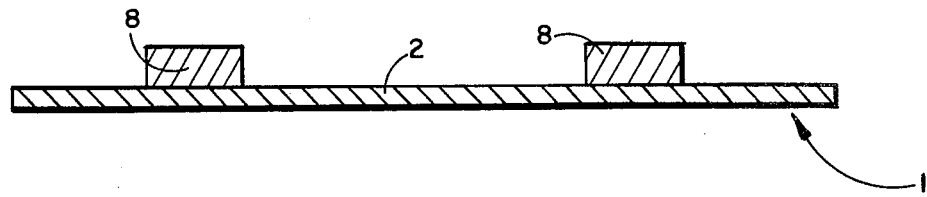

In FIG. 3, the masking material is removed from the conductive sheet 2 by any convenient process leaving only the predetermined pattern of raised conductors 8 on sheet 2. For example, if the masking material were RISTON, then the RISTON may be removed by a suitable solvent. The process for removing the masking material from the conductive sheet 2 is determined by the type of masking material employed to form the instant interconnect system.

Figure 4:
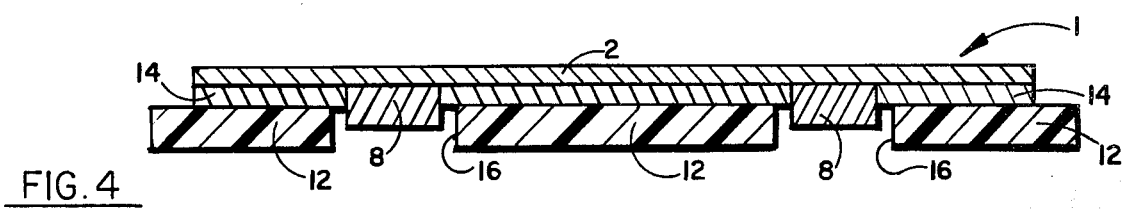

In FIG. 4, the conductive sheet 2 is attached to an electrically insulating base member 12. The base 12, typically a printed circuit board, a flexible film or the like, is selectively cut or punched so as to include voids 16 which generally correspond in configuration to that of the raised conductors 8. The voids 16 punched into the base 12 define the locations for the feedthroughs of one layer 1 of the circuit interconnect system. The base 12 is comprised of a material having a high electrical resistivity, which may be that known in the art as KAPTON. The conductive sheet 2 and the base 12 are coated with a suitable laminating material 14 (e.g. such as an epoxy). The conductive sheet 2 is aligned with the base 12 so that the raised conductors 8 extend into the voids 16, as shown.

Figure 5:
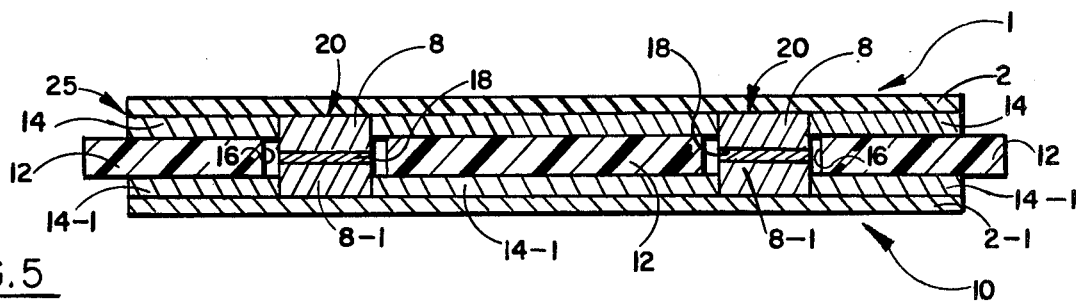

FIG. 5 shows a composite multilayer laminate 25 including the feedthroughs 20 of the instant interconnect system formed by the process herein disclosed. A second layer 10, identical to layer 1, is formed by repeating the steps as described while referring to FIGS. 1–4. Electrically conductive sheet 2-1 of layer 10 is coated with the lamination material 14-1 and attached to the base 12, as shown. Layers 1 and 10 are aligned relative to one another so that the respective raised conductors 8 and 8-1 extend through the selectively punched voids 16 in base 12.

The raised conductors 8 and 8-1 of layers 1 and 10, respectively, are secured to one another at junction 18 by a suitable metallurgical joining process, depending upon the composition of the raised conductors 8 and 8-1. For example, if the raised conductors are comprised of gold, a diffusion bond may be formed between raised conductor 8 and 8-1. Alternatively, if the raised conductors are comprised of copper, a fusion bond may be formed between conductors 8 and 8-1 with the addition of a third conductor material, such as that typically having a lead-tin composition (e.g. solder). It is to be understood that the foregoing are only examples of typical metallurgical processes which may be employed for joining raised conductors 8 and 8-1 together for forming the electrically conducting feedthroughs 20 of the multilayer interconnect system of the instant invention. Other suitable conventional bonding techniques, such as thermal compression, resistance welding, ultrasonic bonding, etc., may also be utilized, depending upon the materials comprising raised conductors 8 and 8-1.

Figure 6:
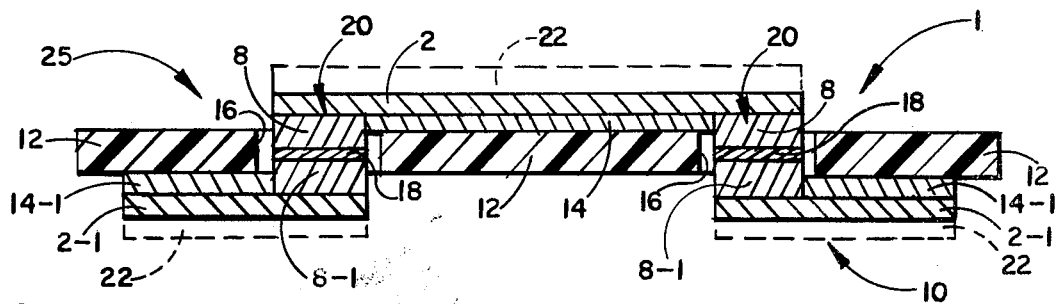

Referring to FIG. 6, the desired circuit pattern to be formed on both sides of the insulating base 12 is defined by removing the excess of the continuous conductive sheets 2 and 2-1 and the laminated material 14 and 14-1 from layers 1 and 10 of the instant composite laminate 25. This is accomplished by a suitable process, which may typically consist of a conventional etching procedure.

By virtue of the instant process, a multilayer circuit interconnect system is achieved which has a continuous electrically conductive path formed on both sides of an insulating base. The conductive feedthroughs or vias of the instant invention can be selectively made in widths reduced to as small as the width of a circuit line. Because of the relatively small through-hole area consumed by the instant feedthrough configuration, the instant process is ideally suited for closely meshed circuits having high density conductor lines. Moreover, since the feedthroughs of the instant invention may essentially consist of a fine conductive line protruding through a hole in the base member from one conductive layer to another, circuit noise is minimized, as compared with that of conventional multilayer interconnect systems.

The instant process herein disclosed is applicable to all flexible printed circuit systems including polyimide and polyamide-imide type printed circuit systems. Additionally, the instant process may be employed for matrixing circuitry in magnetic bubble domain memory systems or the like. It is also to be understood that the instant process may be utilized for providing an interconnect system for a circuit comprised of any suitable plurality of conductive layers. For example, additional conductor "buttons" (or 8-1) can be formed on the opposite surface of conductive sheet 2 (or 2-1). These additional raised conductors can then be joined with aligned conductors on similar devices. Thus, a multilayer arrangement is provided.

It will be apparent that while a preferred embodiment of the invention has been shown and described, various modifications and changes may be made without departing from the true spirit and scope of the invention. For example, the continuous conductive sheet of each layer of the composite laminate (i.e., as shown in FIG. 6) may be plated with a suitable conductive material (e.g. gold or the like) thereby providing an oxidation and corrosion resistant surface for the conductive sheets. Also, raised conductors 8 may be provided on opposite sides of a conductive sheet 2. That is both sides of the sheet may be operated upon concurrently (or consecutively) to produce a conductive sheet with suitable conductor patterns on the opposite sides thereof.

Having thus set forth a preferred embodiment of the instant invention, what is claimed is:

1. A process for making an interconnect system for a multilayer circuit, which comprises:
    applying a masking material in a prescribed pattern selectively including masked and unmasked areas to first and second electrically conductive sheets;
    filling said selectively unmasked areas with an electrically conductive material;
    removing the masking material from each of said first and second sheets, thereby leaving said prescribed pattern of conductive material on each of said respective sheets;
    removing through-hole areas from an electrically insulating substrate, said areas substantially corresponding in configuration to that of said prescribed pattern of conductive material;
    coating at least some of said first and second conductive sheets and said insulating substrate with a laminating material;
    affixing said first and second conductive sheets to said substrate so that said respective conductive material on each of said sheets is substantially aligned with respect to one another in said through-hole areas of said substrate;
    removing selected portions of said first and second conductive sheets to accordingly interconnect circuit lines of said multilayer circuit through said conductive material in said through-hole areas of said substrate; and
    plating said interconnect system with a protective layer of material.

2. The process recited in claim 1, further comprising joining said respective conductive material on each of said first and second conductive sheets to one another in said through-hole areas.

3. The process recited in claim 1 wherein said masking material is applied to only one surface of each of said electrically conductive sheets.

4. The process recited in claim 1 wherein said filling step is performed using an electro-chemical technique.

5. The process recited in claim 1 wherein each of the steps is repeated in order to provide an interconnect system having multiple layers.

6. The process recited in claim 2 including adding an additional layer of conductive mateial to said pattern of conductive material.

7. The process recited in claim 1, wherein said insulating substrate is comprised of a flexible material.

* * * * *